(12) United States Patent
Tanimura et al.

(10) Patent No.: US 10,480,762 B2
(45) Date of Patent: Nov. 19, 2019

(54) LIGHTING FIXTURE

(71) Applicant: PANASONIC INTELLECTUAL PROPERTY MANAGEMENT CO., LTD., Osaka (JP)

(72) Inventors: Ichirou Tanimura, Osaka (JP); Hiroe Kubo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 231 days.

(21) Appl. No.: 15/450,350

(22) Filed: Mar. 6, 2017

(65) Prior Publication Data
US 2017/0254519 A1   Sep. 7, 2017

(30) Foreign Application Priority Data

Mar. 7, 2016  (JP) .................................. 2016-043891

(51) Int. Cl.
*F21S 4/00* (2016.01)
*F21V 21/14* (2006.01)
(Continued)

(52) U.S. Cl.
CPC ................ *F21V 21/14* (2013.01); *F21K 9/68* (2016.08); *F21V 9/08* (2013.01); *F21V 9/30* (2018.02);
(Continued)

(58) Field of Classification Search
CPC . F21V 21/14; F21V 9/30; F21V 21/35; F21V 29/70; F21V 23/002; F21V 23/06;
(Continued)

(56) References Cited

U.S. PATENT DOCUMENTS

| 4,109,305 A | 8/1978 | Claussen et al. |
| 7,427,153 B1 * | 9/2008 | Jacobs ................. G02B 6/0008 |
| | | 362/249.01 |

(Continued)

FOREIGN PATENT DOCUMENTS

| JP | 57-90510 | 6/1982 |
| JP | 58-96614 | 6/1983 |

(Continued)

OTHER PUBLICATIONS

U.S. Appl. No. 15/450,403 to Ichirou Tanimura et al., filed Mar. 6, 2017.

(Continued)

*Primary Examiner* — William J Carter
*Assistant Examiner* — Omar Rojas Cadima
(74) *Attorney, Agent, or Firm* — Greenblum & Bernstein, P.L.C.

(57) ABSTRACT

A lighting fixture is provided. The lighting fixture includes a fixture body including an elongated shape, a first end, and a second end. First and second body mounts are connected to the fixture body and configured to be mounted on first and second lighting ducts. A light source is accommodated in the fixture body and configured to emit laser light. A power supply is accommodated in the fixture body and electrically connected to the light source. A light guide includes an entrance end and an exit end. The entrance end is optically connected to the light source. The light guide is configured to guide the laser light from the light source to the exit end. A lamp is attached to the fixture body and optically connected to the exit end of the light guide.

20 Claims, 5 Drawing Sheets

(51) Int. Cl.
| | |
|---|---|
| *F21K 9/68* | (2016.01) |
| *F21V 9/08* | (2018.01) |
| *F21V 21/22* | (2006.01) |
| *F21V 23/00* | (2015.01) |
| *F21V 23/06* | (2006.01) |
| *F21V 8/00* | (2006.01) |
| *H01S 5/40* | (2006.01) |
| *F21V 21/35* | (2006.01) |
| *F21V 9/30* | (2018.01) |
| *F21V 29/70* | (2015.01) |
| *F21Y 115/30* | (2016.01) |
| *F21S 8/04* | (2006.01) |

(52) U.S. Cl.
CPC .............. *F21V 21/22* (2013.01); *F21V 21/35* (2013.01); *F21V 23/002* (2013.01); *F21V 23/06* (2013.01); *G02B 6/0008* (2013.01); *H01S 5/4012* (2013.01); *H01S 5/4087* (2013.01); *F21S 8/043* (2013.01); *F21V 29/70* (2015.01); *F21Y 2115/30* (2016.08)

(58) Field of Classification Search
CPC .......... F21V 21/22; F21V 9/08; H01S 5/4087; H01S 5/4012; G02B 6/0008; F21K 9/68; F21S 8/043; F21Y 2115/30
See application file for complete search history.

(56) References Cited

U.S. PATENT DOCUMENTS

| | | | |
|---|---|---|---|
| 2006/0152946 A1* | 7/2006 | Chien | ................. A61L 9/03 |
| | | | 362/641 |
| 2011/0044070 A1 | 2/2011 | Takahashi | |
| 2012/0099306 A1* | 4/2012 | Balfour | ................... F21S 8/035 |
| | | | 362/231 |
| 2013/0308324 A1* | 11/2013 | Zaderej | ................... F21S 2/005 |
| | | | 362/362 |
| 2014/0079088 A1* | 3/2014 | Joseph | ............... G02B 27/0905 |
| | | | 372/50.12 |
| 2015/0211701 A1* | 7/2015 | Chien | ..................... F21S 8/035 |
| | | | 362/644 |

FOREIGN PATENT DOCUMENTS

| | | |
|---|---|---|
| JP | 05-41107 | 2/1993 |
| JP | 2009-140669 | 6/2009 |
| JP | 2013-214470 | 10/2013 |
| JP | 2013-219039 | 10/2013 |
| JP | 2014-022160 | 2/2014 |
| JP | 2014-146503 | 8/2014 |
| WO | WO-2013081069 A1 * | 6/2013 ............. G02B 6/002 |

OTHER PUBLICATIONS

Office Action from Japan Patent Office (JPO) in Japanese Patent Appl. No. 2016-043891, dated Sep. 17, 2019.

\* cited by examiner

LIGHTING FIXTURE

CROSS REFERENCE TO RELATED APPLICATION

This application claims the benefit of priority of Japanese Patent Application Number 2016-043891 filed on Mar. 7, 2016, the entire content of which is hereby incorporated by reference.

BACKGROUND

1. Technical Field

The present disclosure relates to a lighting fixture using laser light.

2. Description of the Related Art

A conventional lighting fixture, for example, a spotlight lighting fixture, is used at a shop, museum, or art museum to provide spot lighting for objects such as goods for sale or work pieces. Such a spotlight lighting fixture is used in electrical and mechanical connection with a lighting duct installed on the ceiling (e.g., see Patent Literature 1: Japanese Unexamined Patent Application Publication No. 2014-146503).

The lighting fixture disclosed in Patent Literature 1 includes a power box including a power supply circuit therein, an arm having one end attached to the power box, and a lamp attached to the other end of the arm and including a lighting source therein. The power box included in the lighting fixture disclosed in Patent Literature 1 is secured to the lighting duct. A connection between the arm of the lighting fixture and the lamp and a connection between the power box and the arm are angularly adjustable. A user is allowed to flexibly change a direction of emission of light from the lamp by adjusting the angle of each of the connections as appropriate.

SUMMARY

However, the placement of the lamp included in the lighting fixture disclosed in Patent Literature 1 is limited to a location directly below the lighting duct. Thus, the lamp may not be placed at a desired location.

Thus, the present disclosure provides a lighting fixture which includes a lamp that emits light, and also provides an enhanced freedom of placement of the lamp.

In order to solve the above problem, one aspect of the lighting fixture according to the present disclosure is a lighting fixture including: a fixture body including an elongated shape, a first end, and a second end; a first body mount connected to the fixture body and configured to be mounted on a first lighting duct; a second body mount connected to the fixture body and configured to be mounted on a second lighting duct; a light source accommodated in the fixture body and configured to emit laser light; a power supply accommodated in the fixture body and electrically connected to the light source; a light guide including an entrance end and an exit end, the entrance end being optically connected to the light source, the light guide configured to guide the laser light from the light source to the exit end; and a lamp attached to the fixture body and optically connected to the exit end of the light guide.

According to the present disclosure, a lighting fixture which includes a lamp provides an enhanced freedom of placement of the lamp.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

Hereinafter, an embodiment of the present disclosure is described with reference to the accompanying drawings. The embodiment described below is a merely one specific example of the present disclosure. Thus, values, shapes, materials, components, and arrangement and connection between the components, etc. shown in the following embodiment are merely by way of illustration and not intended to limit the present disclosure. Therefore, among the components in the embodiment below, components not recited in any one of the independent claims defining the most generic part of the inventive concept of the present disclosure are described as arbitrary components.

The figures are schematic views and do not necessarily illustrate the present disclosure precisely. In the figures, the same reference sign is used to refer to substantially the same configuration, and duplicate description is thus omitted or simplified.

Embodiment

[1. Overall Configuration]

Initially, a configuration of a lighting fixture according an embodiment of the present disclosure is described with reference to the accompanying drawings.

Figure 1:
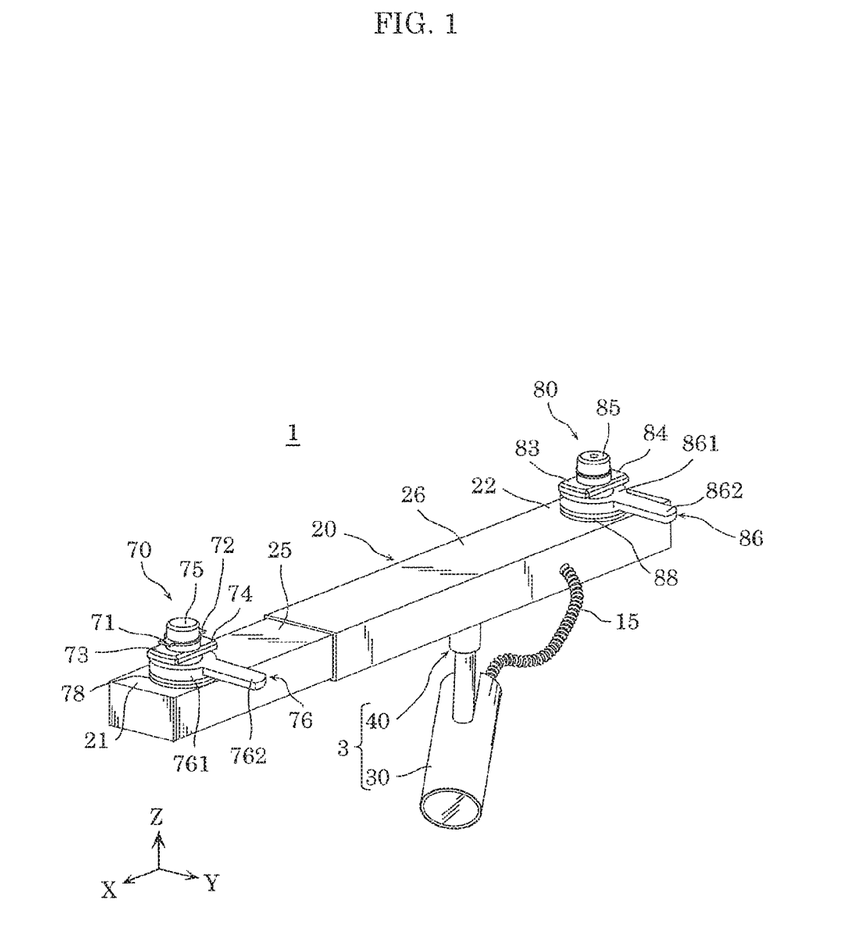
FIG. 1 is a perspective view of an appearance of a lighting fixture according to an embodiment of the present disclosure.

FIG. 1 is a perspective view of an appearance of lighting fixture 1 according to the present embodiment. It should be noted that in FIG. 1 and the figures below, a direction parallel with the longitudinal direction of fixture body 20 included in lighting fixture 1 is referred to as X-axis direction, two directions which intersect and are perpendicular to X-axis are referred to as Y-axis direction and Z-axis direction, respectively. In the present embodiment, Z-axis direction refers to the vertical direction.

Figure 2:
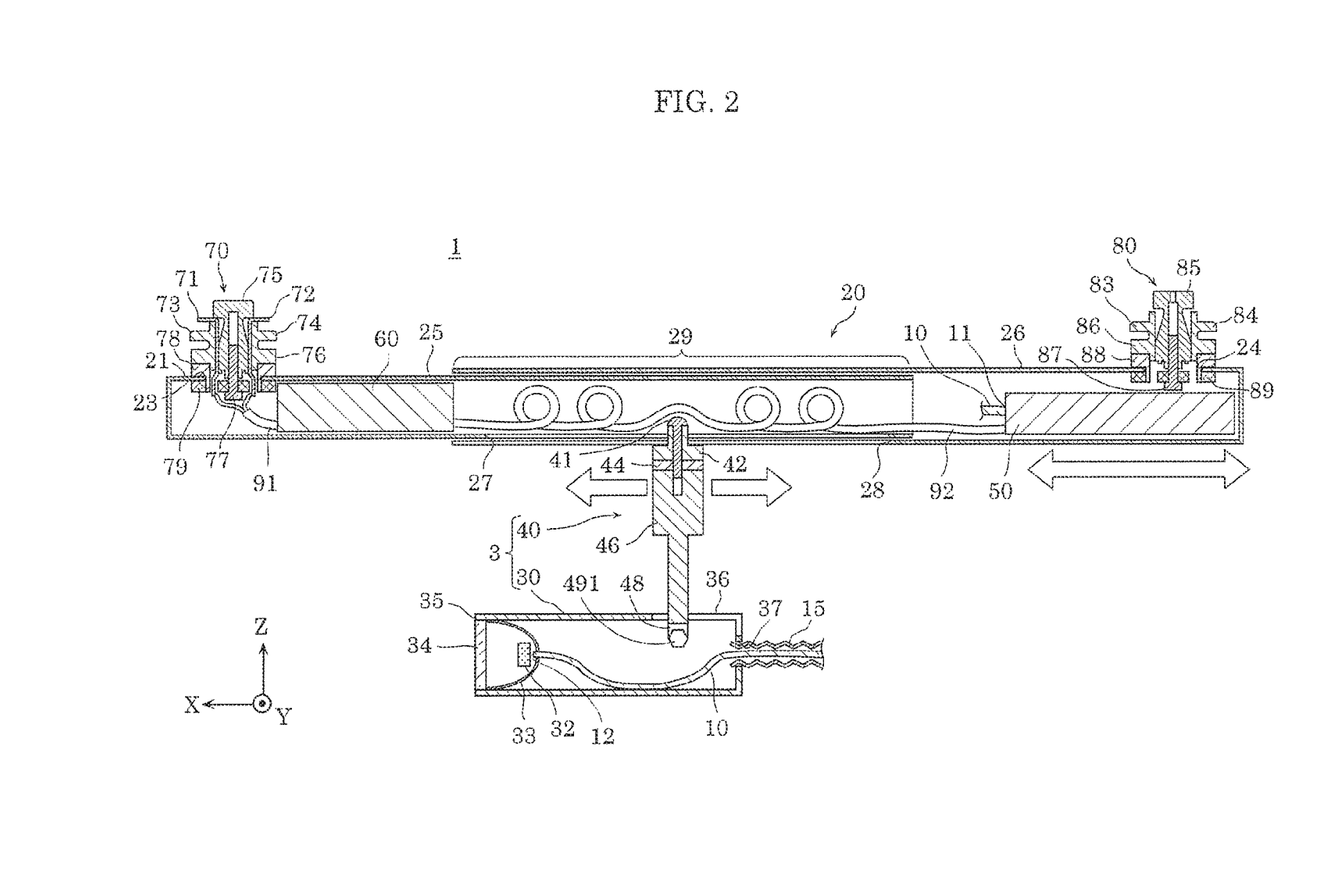
FIG. 2 is a cross-sectional view of an internal structure of a fixture body of the lighting fixture according to the embodiment.

FIG. 2 is a cross-sectional view of a configuration of lighting fixture 1 according to the present embodiment, taken along a plane extending through the center of lighting fixture 1 and in parallel with ZX plane.

Figure 3:
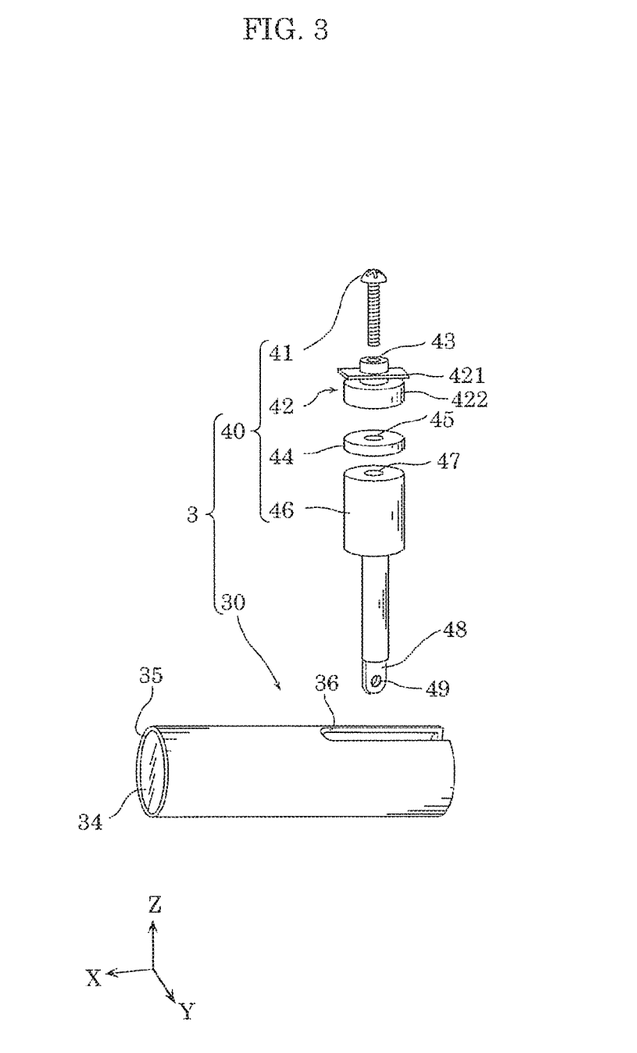
FIG. 3 is an exploded perspective view of configurations of a lamp and a support stem included in the lighting fixture according to the embodiment.

FIG. 3 is an exploded perspective view of configurations of lamp 3 and support stem 40 included in lighting fixture 1 according to the present embodiment.

Figure 4:
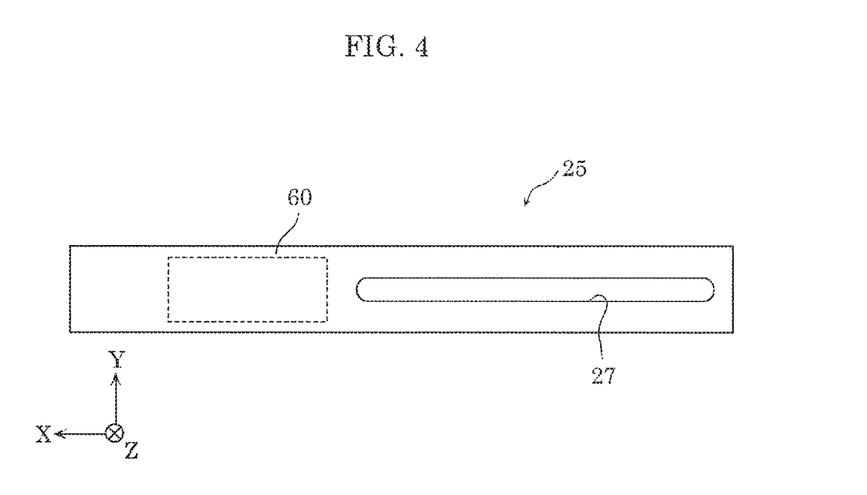
FIG. 4 is a bottom view of an appearance of a first fixture included in the fixture body according to the embodiment.

FIG. 4 is a bottom view of an appearance of first fixture 25 included in fixture body 20 according to the present embodiment. In FIG. 4, an area where power supply 60 is disposed is indicated by the dotted box.

Figure 5:
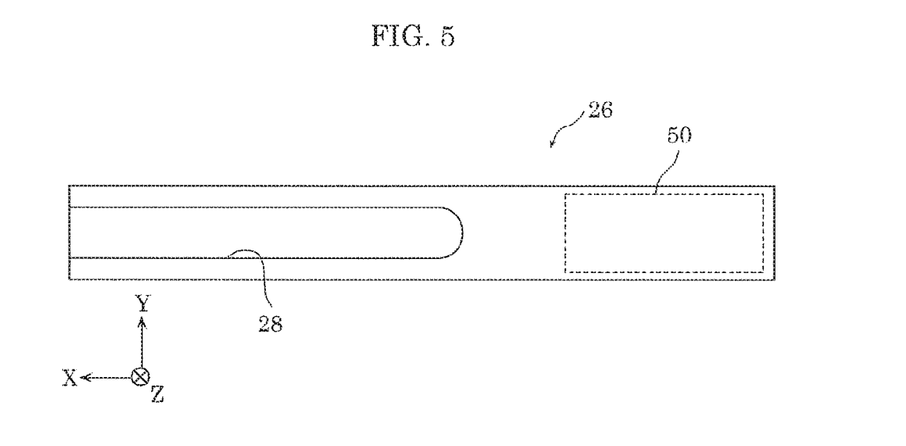
FIG. 5 is a bottom view of an appearance of a second fixture included in the fixture body according to the embodiment.

FIG. 5 is a bottom view of an appearance of second fixture 26 included in fixture body 20 according to the present embodiment. In FIG. 5, an area where light source 50 is disposed is indicated by the dotted box.

As illustrated in FIG. 1, lighting fixture 1 according to the present embodiment is a spotlight lighting fixture. Lighting fixture 1 includes fixture body 20, lamp 3, and support stem 40. As illustrated in FIG. 2, lighting fixture 1 further includes light source 50, power supply 60, and light guide 10 in fixture body 20. In the following, each of the components included in lighting fixture 1 is described.

[1-1. Fixture Body]

Fixture body 20 is, as illustrated in FIG. 1, an elongated member having first end 21 and second end 22. In the present embodiment, fixture body 20 is, as illustrated in FIG. 2, an elongated housing which accommodates light source 50 and power supply 60. First end 21 and second end 22 of fixture body 20 have structures for attaching first body mount 70 and second body mount 80, respectively, thereto. In the present embodiment, as illustrated in FIG. 2, first end 21 and second end 22 of fixture body 20 have through-hole 23 and through-hole 24, respectively, as the structures. Fixture body 20 is mounted on a first lighting duct and a second lighting duct at first body mount 70 and second body mount 80, respectively. The second lighting duct and the first lighting duct may be separate lighting ducts or may be a same lighting duct.

Fixture body 20 includes, as illustrated in FIGS. 1 and 2, first fixture 25 disposed on a first end 21 side and second fixture 26 disposed on a second end 22 side. In the present embodiment, first fixture 25 and second fixture 26 have closed-end cylindrical shapes having rectangular cross sections (cross sections parallel with YZ plane). Second fixture 26 has a cross-sectional shape substantially similar to a cross-sectional shape of first fixture 25, and a cross section greater than a cross section of first fixture 25. This allows, as illustrated in FIGS. 1 and 2, first fixture 25 and second fixture 26 to be mated. Fixture body 20 may, but not limited to, have a length of 0.3 m or more and 1.5 m or less.

As illustrated in FIGS. 2 and 4, guide groove 27 is formed in an underlying (vertically underlying) surface of first fixture 25 in the negative Z-axis direction. Guide groove 27 is formed along the longitudinal direction of fixture body 20 and lamp 3 is received in guide groove 27. Lamp 3 is received in guide groove 27 in a manner that placement of lamp 3 is changeable. In other words, lamp 3 can be placed at any location in guide groove 27 and the placement of lamp 3 is changeable. In the underlying (vertically underlying) surface of first fixture 25 in the negative Z-axis direction, guide groove 27 is formed in, for example, an area close to second fixture 26 in which power supply 60 is not disposed.

As illustrated in FIGS. 2 and 5, slit 28 is formed in the underlying (vertically underlying) surface of second fixture 26 in the negative Z-axis direction. Slit 28 has a structure for inhibiting interference between second fixture 26 and lamp 3 when lamp 3 is received in guide groove 27 of first fixture 25. Slit 28 has a width (width in Y-axis direction) greater than a dimension of disc portion 422 of lamp 3 in Y-axis direction. This allows interference between second fixture 26 and lamp 3 to be inhibited. In the underlying (vertically underlying) surface of second fixture 26 in the negative Z-axis direction, slit 28 is formed in, for example, an area close to first fixture 25 in which light source 50 is not disposed.

As illustrated in FIG. 2, fixture body 20 also includes telescoping portion 29 which extends and contracts in the longitudinal direction. Telescoping portion 29 is a portion where first fixture 25 and second fixture 26 are mated. Fixture body 20 can be extended and contracted in the longitudinal direction by adjusting a length, in X-axis direction, of the portion where first fixture 25 and second fixture 26 are mated. Although not shown, it should be noted that fixture body 20 may have a configuration for securing a position of first fixture 25 relative to second fixture 26.

Materials from which first fixture 25 and second fixture 26 included in fixture body 20 are formed are not particularly limited. First fixture 25 and second fixture 26 are formed of, for example, metallic materials such as aluminum alloy, for example.

In fixture body 20, light source 50 is offset toward second end 22 from the longitudinal center of fixture body 20, and power supply 60 is offset toward first end 21 from the longitudinal center. This allows spacing between power supply 60 and light source 50 to be ensured. Since power supply 60 and light source 50 are both heat generating components, ensuring the spacing therebetween allows a reduction of effects of heat on each other. Moreover, power supply 60 and light source 50, which are heavy components, can be disposed close to first body mount 70 and second body mount 80, respectively, thereby reducing stress on each of first body mount 70, second body mount 80, first fixture 25 and second fixture 26.

First body mount 70 is used to mount fixture body 20 on a mounted part. First body mount 70 pivotally mounts fixture body 20 on the mounted part. In the present embodiment, the mounted part is the first lighting duct, and first body mount 70 pivotally mounts fixture body 20 on the first lighting duct. First body mount 70, as illustrated in FIG. 1, includes electrode plates 71 and 72, locking portions 73 and 74, mounting shaft 75, operating member 76, and spacer 78. First body mount 70 also includes thread 77 and securing member 79, as illustrated in FIG. 2.

Mounting shaft 75 serves as an axis of rotation of first body mount 70. Mounting shaft 75 has a cylindrical shape and the central axis along Z-axis direction. First body mount 70 is formed pivotable about the central axis of cylindrical mounting shaft 75. A material from which mounting shaft 75 is formed is not particularly limited. Mounting shaft 75 is formed of a resin material such as polycarbonate, for example.

Electrode plates 71 and 72 are planar electrodes and receive AC power from the first lighting duct. As illustrated in FIGS. 1 and 2, electrode plates 71 and 72 are planar members extending perpendicular to the central axis of cylindrical mounting shaft 75 in opposite directions from mounting shaft 75. Electrode plates 71 and 72 are made in contact with a power rail which is provided in the first lighting duct to supply power to electrode plates 71 and 72 while first body mount 70 is mounted on the first lighting duct. This configuration allows the AC voltage from the first lighting duct to be applied to electrode plates 71 and 72. Electrode plates 71 and 72, as illustrated in FIG. 2, extend from first body mount 70 into fixture body 20 and are connected to electrical wire 91. The AC voltage applied to electrode plates 71 and 72 is applied to power supply 60 via electrical wire 91. Materials from which electrode plates 71 and 72 are formed are not particularly limited, insofar as electrode plates 71 and 72 are conductive members. Electrode plates 71 and 72 are formed of metallic materials such as copper, for example.

Locking portions 73 and 74 are plate members which are locked in a locking groove in the first lighting duct. As illustrated in FIGS. 1 and 2, locking portions 73 and 74 are planar members extending perpendicular to the central axis of cylindrical mounting shaft 75 in opposite directions from mounting shaft 75. Materials from which locking portions 73 and 74 are formed are not particularly limited. Locking portions 73 and 74 are formed of insulating materials, such as polycarbonate, for example.

Operating member 76 causes electrode plates 71 and 72 and locking portions 73 and 74 to pivot about the central axis of mounting shaft 75. Operating member 76 includes, as illustrated in FIG. 1, cylindrical portion 761 and protrusion 762 projecting substantially perpendicular to the central axis of mounting shaft 75 from cylindrical portion 761. Operating member 76 is integrally formed with electrode plates 71 and 72 and locking portions 73 and 74. This allows protrusion 762 of operating member 76 to be caused to pivot about the central axis of mounting shaft 75, thereby causing electrode plates 71 and 72 and locking portions 73 and 74 to pivot about the central axis of mounting shaft 75. A material from which operating member 76 is formed is not particularly limited. Operating member 76 is formed of an insulating material such as polycarbonate, for example.

Spacer 78 is disposed between operating member 76 and fixture body 20. Spacer 78 is not integral with operating member 76. This allows operating member 76 to be pivotable about spacer 78. A material from which spacer 78 is formed is not particularly limited. Spacer 78 is formed of an insulating material such as polycarbonate, for example.

Securing member 79 is disposed in fixture body 20 and secures first body mount 70 to fixture body 20. Securing member 79 has a disc shape having an outer diameter greater than through-hole 23. Securing member 79 has a through-hole formed in the center. The through-hole passes thread 77 therethrough. Securing member 79 also has through-holes through which electrode plates 71 and 72 are inserted. A material from which securing member 79 is formed is not particularly limited. Securing member 79 is formed of an insulating material such as polycarbonate, for example.

Thread 77 secures first body mount 70. Thread 77 is threaded from the interior of fixture body 20 through the through-hole in securing member 79 into a threaded hole formed in mounting shaft 75.

To mount first body mount 70 on the first lighting duct, initially, electrode plates 71 and 72 (and locking portions 73 and 74) are arranged side by side in parallel with a groove in the first lighting duct. Next, while maintaining the above arrangement, cylindrical mounting shaft 75, electrode plates 71 and 72, and locking portions 73 and 74 are inserted into the groove in the first lighting duct. Then, while mounting shaft 75, etc. being inserted in the groove in the first lighting duct, operating member 76 is caused to pivot by approximately 90 degrees about mounting shaft 75. Locking portions 73 and 74 are thus locked in the locking groove in the first lighting duct, thereby securing first body mount 70 to the first lighting duct. Here, fixture body 20 is mounted on first body mount 70 in a manner pivotable about mounting shaft 75. Accordingly, fixture body 20 is pivotable relative to the first lighting duct about mounting shaft 75 while lighting fixture 1 is mounted on the first lighting duct. This allows the mounting angle of fixture body 20 relative to the first lighting duct to be changeable.

As with first body mount 70, second body mount 80 is used to mount fixture body 20 on a mounted part. Second body mount 80, as illustrated in FIG. 1, includes locking portions 83 and 84, mounting shaft 85, operating member 86, and spacer 88. Second body mount 80 also includes thread 87 and securing member 89, as illustrated in FIG. 2. Operating member 86 includes cylindrical portion 861 and protrusion 862 projecting from cylindrical portion 861 in a direction substantially perpendicular to the central axis of mounting shaft 85.

As illustrated in FIGS. 1 and 2, second body mount 80 is the same as first body mount 70, except that second body mount 80 includes no electrode plate. Second body mount 80 is mechanically connected to the second lighting duct. On the other hand, since second body mount 80 includes no electrode plate, second body mount 80 is not electrically connected to the second lighting duct. It should be noted that the components included in second body mount 80 have the same configurations as those of the components included in first body mount 70, and thus detailed configurations thereof are omitted.

[1-2. Power Supply]

Power supply 60 is a circuit accommodated in fixture body 20 and electrically connected to light source 50. In the present embodiment, power supply 60 converts the AC power supplied from the first lighting duct into DC power and supplies the DC power to light source 50 via electrical wire 92. Power supply 60 includes, for example, a printed circuit board and electronic components mounted on the printed circuit board. The electronic components mounted on the circuit board include, for example, a capacitor such as an electrolytic capacitor or ceramic capacitor, a resistance element such as a resistor, a rectifying circuit element, a coil element, a transformer, a noise filter, a semiconductor device such as an integrated circuit element or diode, etc. It should be noted that power supply 60 may further include a dimming circuit or boost circuit, for example.

[1-3. Light Source]

Light source 50 is accommodated in fixture body 20 and emits laser light. In the present embodiment, light source 50 includes a semiconductor laser. This achieves a reduction in size of light source 50. The semiconductor laser included in light source 50 is, for example, a nitride semiconductor laser that is fabricated using nitride semiconductor. Laser light emitted by light source 50 is, but not particularly limited to, blue light having a wavelength of 420 nm or more and 500 nm or less, for example. The laser light emitted by light source 50 is guided to lamp 3 via light guide 10.

Light source 50 includes a heat dissipator which dissipates heat caused by the semiconductor laser. The heat dissipator is directly connected or indirectly connected to the semiconductor laser via a member that has high thermal conductivity. The heat dissipator is formed using, for example, a material that has high thermal conductivity such as aluminum. As such, although light source 50 includes relatively large, heavy members such as the heat dissipator, light source 50 is disposed in fixture body 20 in lighting fixture 1, thereby allowing a reduction in size and weight of lamp 3.

[1-4. Light Guide]

Light guide 10, as illustrated in FIG. 2, has entrance end 11 and exit end 12. Entrance end 11 is optically connected to light source 50 and guides the laser light emitted by light source 50 to exit end 12. In the present embodiment, light guide 10 is an optical fiber. As illustrated in FIG. 2, entrance end 11 of light guide 10 is connected to light source 50. Laser light emitted by light source 50 enters entrance end 11, propagates in the interior of light guide 10, and exits through exit end 12. Light guide 10 is formed using, for example, a light transmissive material such as quartz.

Exit end 12 of light guide 10 is disposed at lamp 3. A portion of light guide 10 that is extending from fixture body 20 to lamp 3 is covered with flexible tube 15, as illustrated in FIGS. 1 and 2. This can reduce damage to light guide 10. Flexible tube 15 may be formed of a light shielding member. This can prevent leakage of the laser light out of flexible tube 15, even if the laser light has leaked from light guide 10 due to breakage of light guide 10, for example.

[1-5. Lamp]

Lamp 3 is attached to fixture body 20 and optically connected to exit end 12 of light guide 10. As illustrated in FIG. 1 to FIG. 3, lamp 3 includes lamp body 30 and support stem 40. Laser light enters lamp 3 via light guide 10 and illumination light is emitted by lamp 3 through opening illustrated in FIGS. 1 and 3. In this manner, in lighting fixture 1 according to the present embodiment, the laser light emitted by light source 50 is guided to lamp 3 via light guide 10. In other words, light source 50 is not disposed in lamp 3. For this reason, the size and weight of lamp 3 included in lighting fixture 1 can be reduced. The reduction in size of lamp 3 can make presence of lamp 3 less conspicuous in an illuminated space. In other words, lighting fixture 1 that takes to the illuminated space is achieved.

[1-5-1. Support Stem]

Support stem 40 is received in guide groove 27 in fixture body 20 in a manner that placement of support stem 40 is changeable, and pivotally supports lamp body 30. In this manner, lamp body 30 can be caused to pivot about support stem 40, thereby enhancing an orientational degree of freedom of illumination light emitted by lamp body 30. Support stem 40, as illustrated in FIGS. 2 and 3, includes thread 41, body connection member 42, washer 44, and column member 46.

Body connection member 42 is received in guide groove 27 in fixture body 20. Body connection member 42 has, as illustrated in FIG. 3, through-hole 43 through which thread 41 is inserted. Body connection member 42 includes locking portion 421 which is locked with fixture body 20, and disc portion 422. Locking portion 421 is a planar member extending within XY plane, and locked in guide groove 27. In the state illustrated in FIG. 3, locking portion 421 is a planar member having a rectangular major surface extending in X-axis direction. Locking portion 421 is locked with fixture body 20 by a portion of first fixture 25 in the vicinity of guide groove 27 being fitted between locking portion 421 and disc portion 422.

Washer 44 has a ring shape having through-hole 45 in the center. Washer 44 is disposed between body connection member 42 and column member 46. Thread 41 inserted through through-hole 43 in body connection member 42 is inserted through through-hole 45 in washer 44.

Column member 46 has lamp connection 48 at one end. Column member 46 has threaded hole 47 formed in an end to the fixture body 20 side (in positive Z-axis direction). Thread 41 inserted in through-hole 43 in body connection member 42 and through-hole 45 in washer 44 is threaded in threaded hole 47. This integrates the component members included in support stem 40. This can also prevent body connection member 42 from being caused to pivot in conjunction with column member 46 connected to lamp body 30 pivoting about an axis of rotation of thread 41. Column member 46 has lamp connection 48 at an end to the lamp body 30 side (in negative Z-axis direction). Lamp connection 48 is connected to lamp body 30. In the present embodiment, through-hole 49 is formed in lamp connection 48. Bolt 491 (see FIG. 2) is threaded via through-hole 49 into a threaded hole (not shown) formed in the interior of lamp body 30, thereby connecting lamp body 30 to lamp connection 48. This allows lamp body 30 to be pivotally connected to support stem 40 about the axis of rotation of bolt 491.

To attach support stem 40 to fixture body 20, initially, body connection member 42, washer 44, and column member 46 are integrated by thread 41. Next, locking portion 421 is inserted through guide groove 27 into fixture body 20 while the longitudinal direction of locking portion 421 and the longitudinal direction of guide groove 27 are aligned in parallel to each other. Next, locking portion 421 is caused to pivot by approximately 90 degrees about the axis of rotation of thread 41. This locks portion 421 in guide groove 27.

Materials from which the components included in support stem 40 are formed are not particularly limited. The components included in support stem 40 are formed of metallic materials such as aluminum, for example.

[1-5-2. Lamp Body]

Lamp body 30 is optically connected to exit end 12 of light guide 10 and emits illumination light.

Lamp body 30 has side opening 36 formed therein, as illustrated in FIG. 3. Lamp connection 48 of support stem 40 is inserted in side opening 36. Lamp body 30 is pivotally connected to lamp connection 48 of support stem 40. In the present embodiment, a threaded hole (not shown) into which bolt 491 is threaded is formed in the interior of lamp body 30. Bolt 491 inserted in through-hole 49 in support stem 40 is threaded into the threaded hole. This pivotally connects lamp body 30 to support stem 40.

As illustrated in FIG. 2, lamp body 30 also has through-hole 37 through which light guide 10 is inserted into lamp body 30.

Lamp body 30 has a cylindrical shape having opening 35, and includes optical member 34 disposed in opening 35. Lamp body 30, as illustrated in FIG. 2, also includes wavelength converter 32 and reflective member 33 therein.

Wavelength converter 32 converts a wavelength of the laser light supplied from light source 50 via light guide 10. Wavelength converter 32 is secured to the interior of reflective member 33. Wavelength converter 32 converts a wavelength of at least a portion of the laser light passed through exit end 12 of light guide 10, and emits light. Wavelength converter 32 includes, for example, phosphor which absorbs laser light and converts the laser light into phosphor light having a long wavelength. A material from which the phosphor is made is selected according to a wavelength spectrum of the laser light and wavelength spectrum of illumination light which is emitted by lighting fixture 1. For example, if the laser light has a wavelength of 420 nm or more and 500 nm or less and lighting fixture 1 emits white light, yellow phosphor is used whose primary wavelength range is from 540 nm to 610 nm and upper limit of the wavelength range is about 660 nm.

Reflective member 33 controls distribution of the light emitted by wavelength converter 32. It should be noted that the light emitted by wavelength converter 32 includes not only the phosphor, which is the light having a wavelength converted by wavelength converter 32, but also scattered light, caused by wavelength converter 32, of the laser passed light through exit end 12 of light guide 10. In the present embodiment, reflective member 33 reflects, to optical member 34, the light emitted by wavelength converter 32. Reflective member 33 has a tubular shape having an opening passing through optical axis J.

The inner diameter of reflective member 33, as illustrated in FIG. 4, gradually increases from one end where exit end 12 of light guide 10 is disposed to the other end where optical member 34 is disposed. The light emitted by wavelength converter 32 reflects off the inner surface of reflective member 33.

Reflective member 33 can be formed of, for example, a rigid white resin material such as polybutylene terephthalate. It should be noted that a film made of metal such as aluminum may be disposed on the inner surface of reflective member 33.

Optical member 34 is a light transmissive member and has a light incident surface on which the light from reflective member 33 is incident, and a light exit surface through which the light incident on the light incident surface exits optical member 34. Optical member 34 may have a function of controlling the distribution of the light from reflective member 33 and transmits the light therethrough. For example, optical member 34 may be a Fresnel lens. This allows lighting fixture 1 to collect outgoing light to form a spot-like illumination area.

Optical member 34 is formed using a light-transmissive material. For example, optical member 34 is formed using a transparent resin material such as acrylic or polycarbonate, or a light transmissive material such as a glass material.

[2. Use]

Next, use of lighting fixture 1 according to the present embodiment is described with reference to the accompanying drawings.

Figure 6:
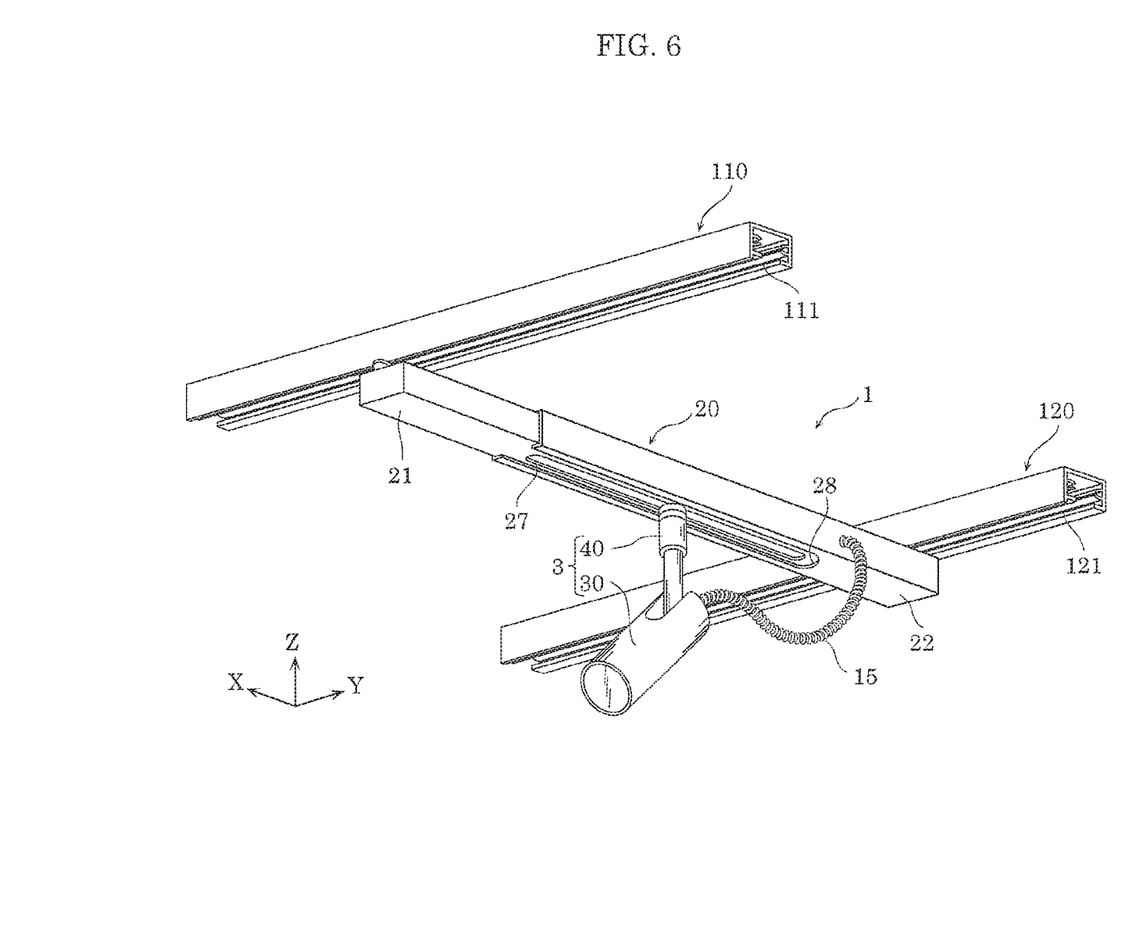
FIG. 6 is a perspective view illustrating use of the lighting fixture according to the embodiment.

FIG. 6 is a perspective view illustrating use of lighting fixture 1 according to the present embodiment.

As illustrated in FIG. 6, lighting fixture 1 according to the present embodiment is mounted on first lighting duct 110 and second lighting duct 120 at first end 21 and second end 22, respectively, of fixture body 20. Although not shown in FIG. 6, it should be noted that first body mount 70 disposed on first end 21 of fixture body 20 is mounted on first lighting duct 110 by being received in groove 111 in first lighting duct 110. Moreover second body mount 80 disposed on second end 22 is mounted on second lighting duct 120 by being received in groove 121 in second lighting duct 120. In other words, lighting fixture 1 according to the present embodiment includes elongated fixture body 20 which has first end 21 and second end 22 and includes first body mount 70 which is mounted on first lighting duct 110 and second body mount 80 which is mounted on second lighting duct 120.

In this manner, lighting fixture 1 according to the present embodiment is disposed over first lighting duct 110 and second lighting duct 120. This allows lamp 3 to be placed between first lighting duct 110 and second lighting duct 120. Moreover, lighting fixture 1 allows lamp 3 to be placed at a position directly below first lighting duct 110 by mounting first body mount 70 and second body mount 80 on first lighting duct 110. As described above, lighting fixture 1 allows lamp 3 to be placed either at a position directly below first lighting duct 110 or between first lighting duct 110 and second lighting duct 120. Thus, lighting fixture 1 provides an enhanced freedom of placement of lamp 3.

Further, in lighting fixture 1 according to the present embodiment, lamp 3 is attached to guide groove 27 in a manner that placement of lamp 3 is changeable. In other words, placement of lamp 3 is changeable in X-axis direction along guide groove 27. Such a configuration allows lighting fixture 1 to provide further enhanced freedom of placement of lamp 3. For example, in the case where lighting fixture 1 is used at a shop, lighting fixture 1 can not only emit illumination light to goods for sale from directly above, which are arranged directly below first lighting duct 110 or second lighting duct 120, but also emit illumination light to goods for sale from directly above, which are arranged at locations between locations that are directly below first lighting duct 110 and second lighting duct 120.

Moreover, in lighting fixture 1 according to the present embodiment, first body mount 70 is disposed on first end 21 of fixture body 20, and second body mount 80 is disposed on second end 22 of fixture body 20. This allows lighting fixture 1 to be mounted over the two lighting ducts arranged apart by spacing substantially equal to the length of fixture body 20. In other words, a range of the spacing between the two lighting ducts over which lighting fixture 1 can be installed may be extended to a limit value determined by the length of fixture body 20.

[3. Summary]

As described above, lighting fixture 1 according to the present embodiment includes: fixture body 20 including an elongated shape, first end 21, and second end 22; first body mount 70 connected to fixture body 20 and configured to be mounted on first lighting duct 110; second body mount 80 connected to fixture body 20 and configured to be mounted on second lighting duct 120; light source 50 accommodated in fixture body 20 and configured to emit laser light; power supply 60 accommodated in fixture body 20 and electrically connected to light source 50; light guide 10 including entrance end 11 and exit end 12, the entrance end 11 being optically connected to light source 50, light guide 10 configured to guide the laser light from light source 50 to exit end 12; and lamp 3 attached to fixture body 20 and optically connected to exit end 12 of light guide 10.

This allows lamp 3 to be placed either at a position directly below first lighting duct 110 or a position between first lighting duct 110 and second lighting duct 120. Thus, lighting fixture 1 provides enhanced freedom of placement of lamp 3. Moreover, since light source 50 included in lighting fixture 1 is disposed in fixture body 20, rather than in lamp 3, the size of lamp 3 can be reduced. This can make presence of lamp 3 less conspicuous in an illuminated space. In other words, lighting fixture 1 that takes to the illuminated space is achieved.

Moreover, in lighting fixture 1, fixture body 20 may include guide groove 27 along a longitudinal direction of fixture body 20, and lamp 3 may be moveably attached to guide groove 27.

In this manner, the placement of lamp 3 is changeable in X-axis direction along guide groove 27. Such a configuration allows lighting fixture 1 to provide further enhanced freedom of placement of lamp 3.

Moreover, in lighting fixture 1, guide groove 27 may be included in fixture body 20 in an area in which power supply 60 is not accommodated.

Moreover, in lighting fixture 1, light source 50 may include a semiconductor laser.

This achieves a reduction in size of light source 50.

Moreover, in lighting fixture 1, first body mount 70 may be disposed on a first end side of fixture body 20 and second body mount 80 may be disposed on a second end side of fixture body 20.

This allows lighting fixture 1 to be mounted over the two lighting ducts arranged apart by spacing substantially equal to the length of fixture body 20. In other words, a range of the spacing between the two lighting ducts over which lighting fixture 1 can be installed may be extended to a limit value determined by the length of fixture body 20.

Moreover, in lighting fixture 1, light source 50 may be offset toward second end 22 from a longitudinal center of fixture body 20, and power supply 60 may be offset toward first end 21 from the longitudinal center.

This allows spacing between power supply 60 and light source 50 to be ensured. Since power supply 60 and light source 50 are both heat generating components, ensuring the spacing therebetween allows a reduction of effects of heat on each other. Moreover, power supply 60 and light source 50, which are heavy components, can be disposed close to first body mount 70 and second body mount 80, respectively, thereby reducing stress on each of first body mount 70, second body mount 80, first fixture 25, and second fixture 26.

Moreover, in lighting fixture 1, fixture body 20 may further include telescoping portion 29 which extends and contracts in a longitudinal direction of fixture body 20.

This allows the length of fixture body 20 to be extended or retracted according to the spacing between the two lighting ducts.

Moreover, in lighting fixture 1, lamp 3 may include wavelength converter 32 configured to convert a wavelength of the laser light.

This allows the spectrum of illumination light emitted by lighting fixture 1 to be tailored.

Moreover, in lighting fixture 1, the laser light may be blue light having a wavelength of 420 nm or more and 500 nm or less.

In this case, lighting fixture 1 is allowed to emit white illumination light by using wavelength converter 32 which includes yellow phosphor, for example.

Moreover, in lighting fixture 1, light source 50 and power supply 60 may be spaced in fixture body 20.

Moreover, in lighting fixture 1, first body mount 70 may be configured to be electrically connected to first lighting duct 110, and second body mount 80 may be configured to be mechanically connected to second lighting duct 120.

Moreover, in lighting fixture 1, first body mount 70 may be disposed on a first end side of fixture body 20, first body mount 70 may include mounting shaft 75 extending from fixture body 20 opposite lamp 3, mounting shaft 75 may include a pair of electrode plates 71 and 72 extending perpendicular to a central axis of mounting shaft 75 in opposite directions from mounting shaft 75, a pair of locking portions 73 and 74, and operating member 76 configured to pivot the pair of electrode plates 71 and 72 and locking portions 73 and 74 about the central axis of mounting shaft 75, second body mount 80 may be disposed on a second end side of fixture body 20, and second body mount 80 may be the same as first body mount 70 except that second body mount 80 does not include the pair of electrode plates 71 and 72.

Moreover, lighting fixture 1 for lamp 3 according to the present embodiment includes: fixture body 20 including an elongated shape, a first end side, a second end side, and a through-hole, the first end side configured to receive first body mount 70 for connecting fixture body 20 to first lighting duct 110, the second end side configured to receive second body mount 80 for connecting fixture body 20 to second lighting duct 120; light source 50 accommodated in fixture body 20 and configured to emit laser light; power supply 60 accommodated in fixture body 20 and electrically connected to light source 50; and light guide 10 accommodated in fixture body 20 and including entrance end 11 and exit end 12, the entrance end 11 being optically connected to light source 50, exit end 12 extending through the through-hole, light guide 10 configured to guide the laser light from light source 50 through the through-hole and to exit end 12.

Moreover, in lighting fixture 1, light source 50 may be offset toward the second end side from a longitudinal center of fixture body 20 and power supply 60 may be offset toward the first end side from the longitudinal center.

Moreover, lighting fixture 1 may further include: first body mount 70: and second body mount 80, wherein first body mount 70 is configured to be electrically connected to first lighting duct 110, and second body mount 80 is configured to be mechanically connected to second lighting duct 120.

Variations

While lighting fixture 1 according to the present disclosure has been described by way of the above embodiment, the present disclosure is not limited to the embodiment.

For example, the laser light source used in light source 60 may be other than the semiconductor laser. For example, the laser light source may be a solid state laser.

Moreover, wavelength converter 32 may be integral with light guide 10. In other words, light guide 10 may include, at the exit end, wavelength converter 32 configured to convert a wavelength of the laser light. This obviates the need for alignment of the optical axes of light guide 10 and wavelength converter 32.

Moreover, lamp 3 may not essentially include wavelength converter 32. For example, lamp 3 may include a scattering member which scatters the laser light, or an optic, for example, for adjusting the spot size of the laser light, in place of wavelength converter 32.

Moreover, the laser light may be laser light other than blue light. For example, the laser light may be violet light having a wavelength of 380 nm or more and less than 420 nm. Alternatively, the laser light may be ultraviolet light having a wavelength of 300 nm or more and less than 380 nm.

Moreover, light source 50 may include a plurality of laser light sources. For example, light source 50 may include semiconductor lasers which emit laser light having different wavelengths. Further, the semiconductor lasers may be controlled independently of each other, and lamp 3 may emit combined light comprising the laser light emitted by the semiconductor lasers. In this case, wavelength converter 32 is not an essential component.

Moreover, while the optical fiber is used as light guide 10 included in lighting fixture 1, a member other than the optical fiber may be used as light guide 10. For example, as light guide 10, an optic configured of a reflective member which propagates the laser light in a free space may be used, for example.

In other instances, various modifications to the exemplary embodiment according to the present disclosure described above that may be conceived by a person skilled in the art and embodiments implemented in any combination of the components and functions shown in the exemplary embodiment are also included within the scope of the present disclosure, without departing from the spirit of the present disclosure.

What is claimed is:

1. A lighting fixture, comprising:
  a fixture body including an elongated shape, a first end, and a second end;
  a first body mount connected to the fixture body and configured to be mounted on a first lighting duct;
  a second body mount connected to the fixture body and configured to be mounted on a second lighting duct;
  a light source accommodated in the fixture body and configured to emit laser light;
  a power supply accommodated in the fixture body and electrically connected to the light source;
  a light guide including an entrance end and an exit end, the entrance end being optically connected to the light source, the light guide configured to guide the laser light from the light source to the exit end; and
  a lamp attached to the fixture body and optically connected to the exit end of the light guide, wherein the first body mount includes a mounting shaft extending from an opposite side of the fixture body than the lamp, and the mounting shaft includes a pair of electrode plates extending perpendicular to a central axis of the mounting shaft in opposite directions from the mounting shaft, a pair of locking portions, and an operating member configured to pivot the pair of electrode plates and the locking portions about the central axis of the mounting shaft and to move the pair of electrode plates and the locking portions relative to the fixture body.

2. The lighting fixture according to claim 1, wherein the fixture body includes a guide groove along a longitudinal direction of the fixture body, and the lamp is moveably attached to the guide groove.

3. The lighting fixture according to claim 2, wherein the guide groove is included in the fixture body in an area in which the power supply is not accommodated.

4. The lighting fixture according to claim 1, wherein the light source includes a semiconductor laser which emits the laser light.

5. The lighting fixture according to claim 4, wherein the semiconductor laser comprises a plurality of semiconductor lasers which emit laser light having different wavelengths.

6. The lighting fixture according to claim 5, wherein each of the plurality of semiconductor lasers is controlled independently, and the lamp is configured to emit the laser light including combined light emitted by the plurality of semiconductor lasers.

7. The lighting fixture according to claim 1, wherein the first body mount is disposed on a first end side of the fixture body and the second body mount is disposed on a second end side of the fixture body.

8. The lighting fixture according to claim 1, wherein the light source is offset toward the second end from a longitudinal center of the fixture body and the power supply is offset toward the first end from the longitudinal center.

9. The lighting fixture according to claim 1, wherein the fixture body further includes a telescoping portion which extends and contracts in a longitudinal direction of the fixture body.

10. The lighting fixture according to claim 1, wherein the lamp includes a wavelength converter configured to convert a wavelength of the laser light.

11. The lighting fixture according to claim 1, wherein the light guide includes, at the exit end, a wavelength converter configured to convert a wavelength of the laser light.

12. The lighting fixture according to claim 1, wherein the laser light is blue light having a wavelength of 420 nm or more and 500 nm or less.

13. The lighting fixture according to claim 1, wherein the laser light is violet light having a wavelength of 380 nm or more and less than 420 nm.

14. The lighting fixture according to claim 1, wherein the laser light is ultraviolet light having a wavelength of 300 nm or more and less than 380 nm.

15. The lighting fixture according to claim 1, wherein the light source and the power supply are spaced in the fixture body.

16. The lighting fixture according to claim 1, wherein the first body mount is configured to be electrically connected to the first lighting duct, and the second body mount is configured to be mechanically connected to the second lighting duct.

17. The lighting fixture according to claim 16, wherein the first body mount is disposed on a first end side of the fixture body, the second body mount is disposed on a second end side of the fixture body, and the second body mount is same as the first body mount except that the second body mount does not include the pair of electrode plates.

18. A lighting fixture for a lamp, the lighting fixture comprising:

a fixture body including an elongated shape, a first end side, a second end side, and a through-hole, the first end side configured to receive a first body mount for connecting the fixture body to a first lighting duct, the second end side configured to receive a second body mount for connecting the fixture body to a second lighting duct;

a light source accommodated in the fixture body and configured to emit laser light;

a power supply accommodated in the fixture body and electrically connected to the light source; and a light guide accommodated in the fixture body and including an entrance end and an exit end, the entrance end being optically connected to the light source, the exit end extending through the through-hole, the light guide configured to guide the laser light from the light source through the through-hole to the exit end, wherein the first body mount includes a mounting shaft extending from an opposite side of the fixture body than a side at which the lamp is configured to be received, and the mounting shaft includes a pair of electrode plates extending perpendicular to a central axis of the mounting shaft in opposite directions from the mounting shaft, a pair of locking portions, and an operating member configured to pivot the pair of electrode plates and the locking portions about the central axis of the mounting shaft and to move the pair of electrode plates and the locking portions relative to the fixture body.

19. The lighting fixture according to claim 18, wherein the light source is offset toward the second end side from a longitudinal center of the fixture body and the power supply is offset toward the first end side from the longitudinal center.

20. The lighting fixture according to claim 19, further comprising:

the first body mount; and the second body mount, wherein the first body mount is configured to be electrically connected to the first lighting duct, and the second body mount is configured to be mechanically connected to the second lighting duct.

* * * * *